(12) United States Patent
Potelle et al.

(10) Patent No.: US 10,793,970 B2
(45) Date of Patent: Oct. 6, 2020

(54) METHOD OF FABRICATING A TURBINE ENGINE PART

(71) Applicants: SAFRAN AIRCRAFT ENGINES, Paris (FR); SAFRAN, Paris (FR); CENTRE NATIONAL DE LA RECHERCHE SCIENTIFIQUE (CNRS), Paris (FR); UNIVERSITE CLAUDE BERNARD LYON 1, Villeurbanne (FR)

(72) Inventors: Amélie Potelle, Moissy-Cramayel (FR); Omar Benamara, Lyons (FR); Kheirreddine Lebbou, Villeurbanne (FR); Michaël Podgorski, Moissy-Cramayel (FR)

(73) Assignees: SAFRAN AIRCRAFT ENGINES, Paris (FR); SAFRAN, Paris (FR); CENTRE NATIONAL DE LA RECHERCHE SCIENTIFIQUE, Paris (FR); UNIVERSITE CLAUDE BERNARD LYON 1, Villeurbanne (FR)

( * ) Notice: Subject to any disclaimer, the term of this patent is extended or adjusted under 35 U.S.C. 154(b) by 106 days.

(21) Appl. No.: 16/310,238

(22) PCT Filed: Jun. 14, 2017

(86) PCT No.: PCT/FR2017/051531
§ 371 (c)(1),
(2) Date: Dec. 14, 2018

(87) PCT Pub. No.: WO2017/216481
PCT Pub. Date: Dec. 21, 2017

(65) Prior Publication Data
US 2019/0330759 A1    Oct. 31, 2019

(30) Foreign Application Priority Data

Jun. 15, 2016 (FR) .................................. 16 55540

(51) Int. Cl.
*C30B 15/00* (2006.01)
*C30B 15/20* (2006.01)
(Continued)

(52) U.S. Cl.
CPC .......... *C30B 15/203* (2013.01); *C04B 35/109* (2013.01); *C30B 21/06* (2013.01);
(Continued)

(58) Field of Classification Search
CPC ......... C30B 15/00; C30B 15/02; C30B 15/30; C30B 29/20; C30B 29/22
See application file for complete search history.

(56) References Cited

U.S. PATENT DOCUMENTS 4,792,377 A * 12/1988 Dunn ........................ C30B 9/00
117/36
5,468,548 A * 11/1995 Giamei ............. C04B 35/62231
428/292.1
(Continued)

FOREIGN PATENT DOCUMENTS

WO    WO 95/04013 A1    2/1995

OTHER PUBLICATIONS

International Search Report as issued in International Patent Application No. PCT/FR2017/051531, dated Oct. 2, 2017.
(Continued)

*Primary Examiner* — Robert M Kunemund
(74) *Attorney, Agent, or Firm* — Pillsbury Winthrop Shaw Pittman LLP

(57) ABSTRACT

A method of fabricating a turbine engine part, the method including fabricating an ingot out of ceramic material of
(Continued)

eutectic composition by performing the Czochralski process including putting a seed of the ingot that is to be obtained into contact with a molten bath of a mixture of eutectic composition in order to initiate the formation of the ingot on the seed, the mixture including at least two ceramic compounds; drawing the ingot from the molten bath while imposing on the ingot that is being formed a drawing speed less than or equal to 10 mm/h together with rotation at a speed of rotation less than or equal to 50 rpm; and machining the ingot as fabricated in this way in order to obtain the turbine engine part.

10 Claims, 3 Drawing Sheets

(51) Int. Cl.
C04B 35/109 (2006.01)
C30B 21/06 (2006.01)
C30B 29/24 (2006.01)
C30B 29/28 (2006.01)
F01D 5/28 (2006.01)
F01D 9/02 (2006.01)

(52) U.S. Cl.
CPC .............. *C30B 29/24* (2013.01); *C30B 29/28* (2013.01); *F01D 5/284* (2013.01); *F01D 9/02* (2013.01); *F05C 2253/083* (2013.01)

(56) References Cited

U.S. PATENT DOCUMENTS

| | | | | |
|---|---|---|---|---|
| 5,573,862 | A | 11/1996 | Gualtieri et al. | |
| 7,323,053 | B2* | 1/2008 | Tohta | C30B 15/08 117/14 |
| 9,915,756 | B2* | 3/2018 | Nordahl | G02B 1/02 |
| 2012/0309632 | A1* | 12/2012 | Goyal | C30B 29/16 505/230 |
| 2016/0154123 | A1* | 6/2016 | Ohashi | G01T 1/2023 250/361 R |

OTHER PUBLICATIONS

Benamara, O., et al., "Microstructure and crystallography of $Al_2O_3$—$Y_3Al_5O_{12}$—$ZrO_2$ ternary eutectic oxide grown by the micropulling down technique," Journal of Crystal Growth, vol. 429, Jul. 2015, XP029273018, pp. 27-34.

Yasuda, H., et al., "Selection of eutectic systems in $Al_2O_3$—$Y_2O_3$ ceramics," Science and Technology of Advanced Materials, vol. 2, (2001), pp. 67-71.

Belouet, C., "About the Crystalline Perfection of Nd-Doped YAG Single Crystals," Journal of Crystal Growth, vol. 15, No. 3, XP024429512, Aug. 1972, pp. 188-194.

* cited by examiner

METHOD OF FABRICATING A TURBINE ENGINE PART

CROSS REFERENCE TO RELATED APPLICATIONS

This application is the U.S. National Stage of PCT/FR2017/051531 filed Jun. 14, 2017, which in turn claims priority to French Application No. 1655540, filed Jun. 15, 2016. The contents of both applications are incorporated herein by reference in their entirety.

BACKGROUND OF THE INVENTION

The invention relates to a method of fabricating a turbine engine part out of ceramic material of eutectic composition.

The superalloys presently in use for highly-stressed turbine engine parts, such as high-pressure turbine blades, have been the subject of considerable development. Such materials can withstand very high mechanical loads at relatively high temperatures. This applies in particular to single crystals of the latest generation of nickel-based alloys. Nevertheless, even when coated in a thermal barrier coating, it can happen that those materials do not have properties good for use above 1100° C. Other materials have been developed for high-temperature applications, such as monolithic ceramics, which may be oxides or other ceramics (carbides or nitrides). Nevertheless, the mechanical properties of those materials can be diminished above 1300° C. The same can apply to ceramic matrix composites (CMGs).

In this context, ceramic materials of eutectic composition constitute an alternative of interest. Specifically, such materials present microstructures that remain stable up to their melting temperatures, and thus almost-constant mechanical strength up to those temperatures, which can be higher than 1700° C. for certain compositions. In addition, those materials also present the advantage of having specific gravities that lie typically in the range 4 to 6, i.e. well below the specific gravities of cast nickel-based superalloys, which lie in the range 8.6 to 8.8, thereby enabling the weight of turbine engines to be reduced.

Nevertheless, present directional solidification methods can fail to control in satisfactory manner the structural morphology of formed materials of eutectic composition. Specifically, while such materials are solidifying, nonuniformities of the composition can lead to the appearance of colonies or crystals that are distributed in a random manner within the matrix or to localized segregation that can degrade the mechanical properties of the formed material, such as its toughness and its breaking stress. It would therefore be desirable to have a directional solidification method enabling the microstructure of the resulting ceramic material of eutectic composition to be controlled in reliable manner so as to guarantee its mechanical properties.

Furthermore, the methods presently in use for fabricating a ceramic material of eutectic composition can involve the use of a mold of complex shape (as in the Bridgman process) or a molybdenum die of complex shape, as with edge defined film fed growth (EFG). Also, the Bridgman process can lead to residual stresses in the resulting crystal, and indeed to it cracking, while the "EFG" method can be limited in terms of the thickness that can be fabricated, thus making it difficult to fabricate a part presenting volume that is sufficient to constitute a turbine engine part. Consequently, it would be desirable to have available a simpler method for fabricating, in satisfactory manner, such a ceramic material of eutectic composition in order to constitute turbine engine parts.

There therefore exists a need to have available a method that enables turbine engine parts to be fabricated out of ceramic material of eutectic composition while presenting microstructure that is controlled and presenting good mechanical properties at high temperature.

There also exists a need to simplify existing methods of fabricating such materials of eutectic composition.

OBJECT AND SUMMARY OF THE INVENTION

To this end, in a first aspect, the invention provides a method of fabricating a turbine engine part, the method comprising the following steps:

fabricating an ingot out of ceramic material of eutectic composition by performing the Czochralski process comprising the following steps:
  putting a seed of the ingot that is to be obtained into contact with a molten bath of a mixture of eutectic composition in order to initiate the formation of the ingot on the seed, said mixture comprising at least two ceramic compounds;
  drawing the ingot from the molten bath while imposing on the ingot that is being formed a drawing speed less than or equal to 10 millimeters per hour (mm/h) together with rotation at a speed of rotation less than or equal to 50 revolutions per minute (rpm); and
machining the ingot as fabricated in this way in order to obtain the turbine engine part.

The term "mixture of eutectic composition" is also referred to herein by the term "eutectic mixture".

The ceramic compounds constituting the eutectic mixture may be oxide ceramics or non-oxide ceramics, e.g. nitrides or carbides.

The eutectic mixture may be a binary mixture, i.e. made up of a mixture of two ceramic compounds, or a ternary mixture that is then constituted by a mixture of three ceramic compounds. Each of the ceramic compounds making up the eutectic mixture is present in proportions corresponding to the proportions of a eutectic point.

By using the Czochralski technique with a determined drawing speed and a determined speed of rotation, the invention serves advantageously to fabricate a turbine engine part out of ceramic material of eutectic composition that presents both microstructure that is controlled and also the desired mechanical properties when hot (i.e. above 1100° C., or even above 1300° C.). One of the advantages of the Czochralski process, when performed with the above-described values for drawing speed and speed of rotation, is that it enables defects of the microstructure to be segregated at the periphery of the ingot, thereby enabling those defects to be eliminated during the machining step. The rotation that is imposed while drawing serves specifically to eject unwanted phases towards the periphery of the ingot, making it possible, after machining, to obtain a part having a microstructure that is uniform. Furthermore, the invention serves advantageously to fabricate turbine engine parts in relatively simple manner out of ceramic material of eutectic composition, which parts may be complex in shape.

In an implementation, the eutectic mixture may include alumina ($Al_2O_3$). In an implementation, the eutectic mixture may include zirconia ($ZrO_2$). The presence of the zirconia in the eutectic mixture serves advantageously to further improve the toughness of the resulting part. In an implementation, the eutectic mixture may include at least: a rare earth oxide, an aluminum and rare earth garnet $RE_3Al_5O_{12}$, or a perovskite $REAlO_3$, where RE designates a rare earth element. The rare earth oxide may have the chemical formula $RE_2O_3$ with RE as defined above and may for example be $Y_2O_3$ or $La_2O_3$.

By way of example, the eutectic mixture may include alumina and zirconia. Under such circumstances, the eutectic mixture may be binary or ternary.

By way of example, the eutectic mixture may be selected from the following mixtures: $Al_2O_3$—$ZrO_2$, $Al_2O_3$-YAG (YAG corresponding to $Y_3Al_5O_{12}$), $RE_3Al_5O_{12}$—$Al_2O_3$ where RE is a rare an element, $Al_2O_3$—$RE_3Al_5O_{12}$—$ZrO_2$, and $Al_2O_3$-YAG-$ZrO_2$.

In an implementation, the ingot being formed may be subjected to a drawing speed lying in the range 1 mm/h to 10 mm/h. In particular, the ingot being formed may be subjected to a drawing speed lying in the range 1 mm/h to 5 mm/h.

In an implementation, the ingot being formed may be subjected to a speed of rotation lying in the range 1 rpm to 30 rpm. In particular, the ingot being formed may be subjected to a speed of rotation lying in the range 1 rpm to 10 rpm.

In an implementation, the fabricated part may be a turbine engine blade or vane.

In an implementation, the fabricated part may be a nozzle.

In an implementation, the fabricated part may be a ring sector.

In an implementation, the fabricated part is a part for an aviation turbine engine. In a variant, it is a part for a terrestrial turbine.

BRIEF DESCRIPTION OF THE DRAWINGS

Other characteristics and advantages of the invention appear from the following description of particular implementations of the invention, given as nonlimiting examples, and with reference to the accompanying drawings, in which.

DETAILED DESCRIPTION OF IMPLEMENTATIONS

Figure 1:
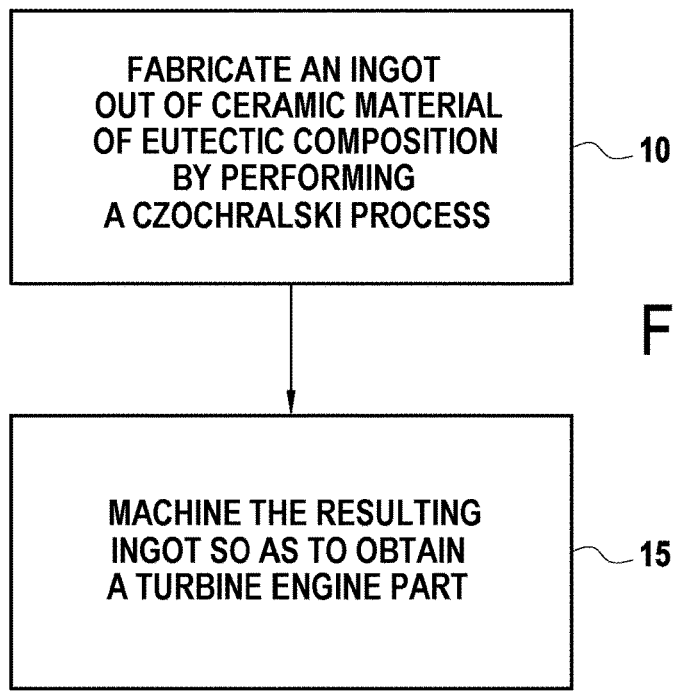
FIG. 1 is a flowchart showing the steps performed for fabricating a turbine machine part by a method of the invention.

FIG. 1 shows two steps. The first step 10 of a method of the invention consists in fabricating an ingot of ceramic material of eutectic composition by performing the Czochralski process. During this step, particular values are used for drawing speed and speed of rotation, in particular in order to control the microstructure of the resulting ingot. The ingot is then machined during a second step 15 in order to form the turbine engine part.

The first step 10 is described below with reference to FIGS. 2A to 2D and 3.

Figure 2A:
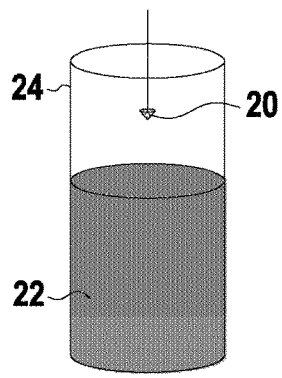
FIGS. 2A to 2D are diagrams showing an ingot of ceramic material of eutectic composition being drawn in the context of a method of the invention.
Figure 2B:
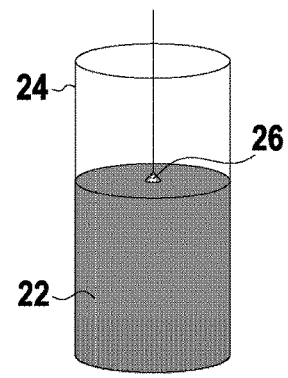
Figure 2C:
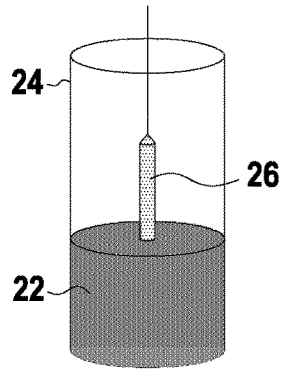
Figure 2D:
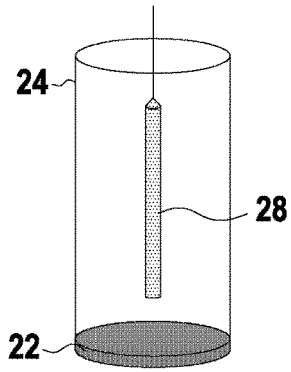

The first step performs a Czochralski process during which a seed 20 of the ceramic material of eutectic composition that is to be obtained is initially put into contact with a molten bath 22 present in a crucible 24 (see FIG. 2A). The seed 20 and the molten bath 22 present the same chemical composition. This chemical composition corresponds to the composition of the ingot that is to be formed. The seed 20 is a little colder than the molten bath 22 (so as to present a temperature gradient at the solid/liquid interface), thereby initiating crystallization of the ingot 26 of the seed 20 when the seed is put into contact with the molten bath 22 (see FIG. 2B). The molten bath 22 solidifies on the seed 20 while keeping the same crystal organization as that of the seed 20 (epitaxy). The drawing of the ingot shown in FIGS. 2B, 2C, and 2D is performed by imposing a nonzero drawing speed on the ingot 26 that is being formed, which speed is less than or equal to 10 mm/h, while also rotating it at a nonzero speed that is less than or equal to 50 rpm. This drawing speed and speed of rotation make it possible to obtain the desired microstructure for the ingot. After drawing, a solid ingot 28 is obtained that is to be machined in order to obtain the turbine engine part. The resulting ingot 28 may be cylindrical in shape, as shown, or in a variant it may be conical in shape. The diameter (greatest transverse dimension) of the resulting ingot 28 may be greater than or equal to 100 mm, for example. The diameter of the resulting ingot 28 can be modified by varying the size of the crucible 24. Also, it is possible to refill the molten bath 22 while drawing the ingot. This serves advantageously to increase the length of the ingot 28 that is drawn. The ingot 28 can be formed without any mold or die, unlike the Bridgman process or the "EFG" process.

Figure 3:
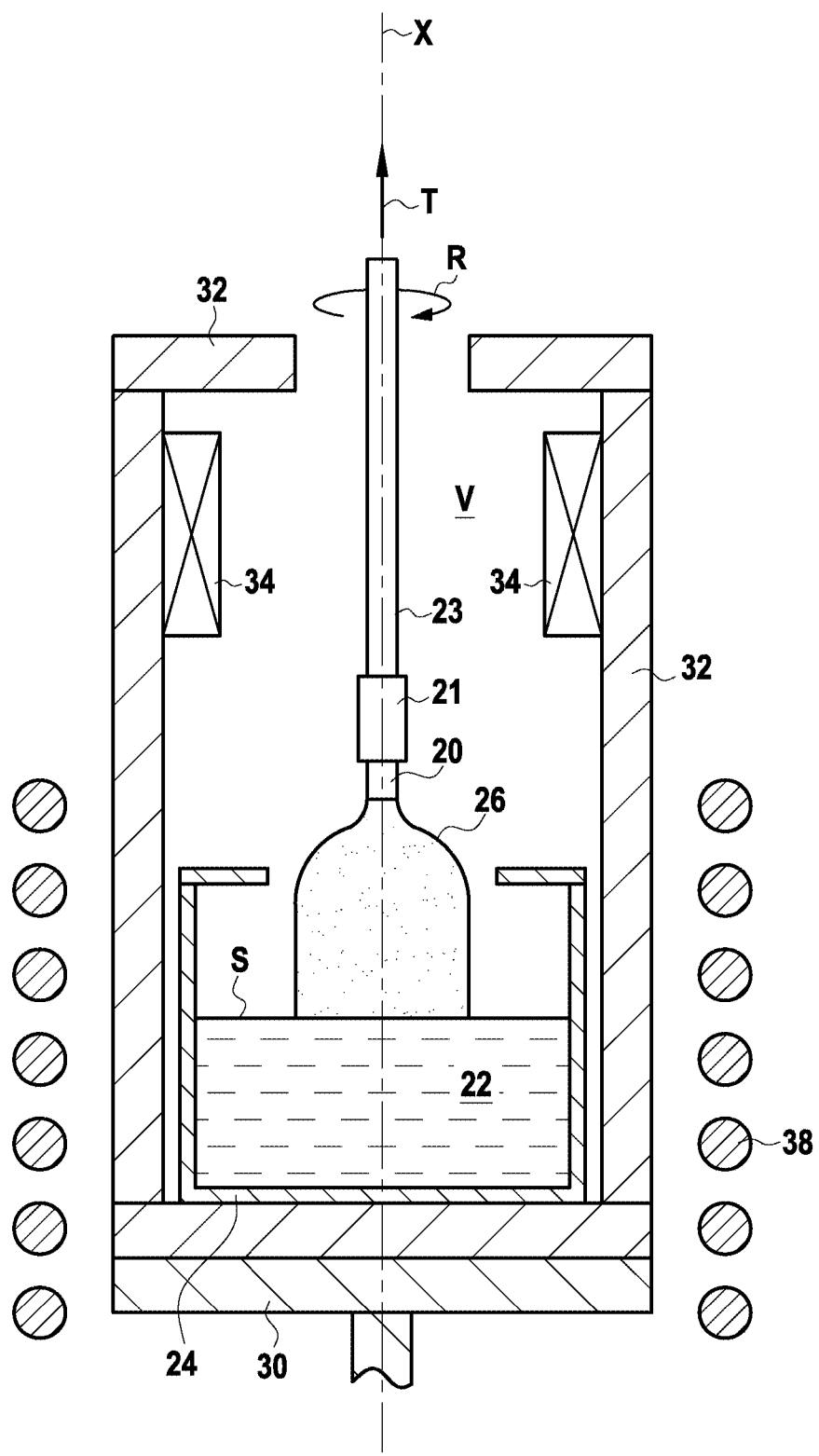
FIG. 3 shows the formation of such an ingot in greater detail.

FIG. 3 shows in greater detail the drawing of the ingot by the Czochralski process. The seed 20 is initially put into contact with the molten bath 22 situated in a crucible 24 made of molybdenum, platinum, or iridium, for example. The crucible 24 is placed on a support tray 30. The material for the crucible 24 is selected so as to have a crucible 24 that withstands the high temperatures involved and that does not react with the molten bath 22. During its formation, the ingot is not in contact with the crucible 24 and so there is no need for it to be unmolded. The bath 22 is maintained in the molten state by being heated by a heater device 38, specifically a coil 38 performing heating by induction. In a variant, it would be possible to use resistive heating.

The seed 20 is present on a seed carrier 21, itself connected to a rod 23. The rod 23 is connected to an automatic mover device (not shown) configured to draw the rod 23 along the axis X in the direction T while simultaneously rotating the rod about its axis (rotary movement referenced R in FIG. 3). These movements of the rod 23 are transmitted to the ingot 26 that is being formed, so it is thus drawn along the direction T and simultaneously it is caused to rotate while it is being drawn.

During the drawing, the crucible 24 and also the ingot 26 that is being formed are present in an inside volume V defined by a thermally insulating wall 32. As shown, the wall 32 may present one or more heat screens 34 on its inside surface. The thermally insulating wall 32 and the heat screens 34 serve to control the temperature of the molten bath 22 and of the ingot 26 that is being formed. In particular, at least in the vicinity of the surface S of the molten bath 22, it is possible to maintain a temperature gradient along the drawing axis X in the ingot 26 that is being formed that is less than or equal to 50° C. per millimeter (° C./mm), e.g. less than or equal to 10° C./mm. Such values for the temperature gradient may be maintained over a distance of not less than 40 millimeters (mm), or indeed 50 mm, from the surface S of the bath 22. In particular, it is possible to maintain such values for the temperature gradient over a distance lying in the range 40 mm to 50 mm from the surface S of the molten bath 22. Furthermore, a cooling circuit (not shown) is present around the insulating wall 32 and the heater device 38. By way of example, it is possible to use water as the cooling liquid. It comes within the general competence of the person skilled in the art to adjust the heating, the nature of the thermal insulation 32 and 34, and the cooling to be implemented in order to obtain the above-described values for the temperature gradient.

As mentioned above, the ingot is formed by being drawn from a molten bath 22 of a eutectic mixture comprising at least two different ceramic compounds. By way of example, each of these ceramic compounds may be an oxide, but it would not go beyond the ambit of the invention for that not to be so, as mentioned above. The eutectic mixture may thus be:

a eutectic mixture of ceramic oxides; or
a eutectic mixture of ceramic carbides; or indeed
a eutectic mixture of ceramic nitrides.

During the drawing step, the ingot 26 that is being formed is subjected to a constant drawing speed along the direction T that is less than or equal to 10 mm/h, together with rotary motion R about the axis X at a constant speed of rotation that is less than or equal to 50 rpm. In the example shown, the direction T and the axis X are perpendicular to the surface S of the molten bath 22. The rod 23 is moved along the direction T and is simultaneously rotated about the axis X during the drawing step. Such values for the drawing speed and the speed of rotation make it possible to obtain steady crystallization conditions and thus to obtain the microstructure desired for the part being fabricated, in particular by limiting any unwanted germination that might give rise to defects degrading mechanical performance.

The atmosphere in the inside volume V may be an atmosphere that is inert (argon, dinitrogen). The pressure in the inside volume V may be less than or equal to atmospheric pressure (1 bar). By way of example, it is possible to use an inert gas flow rate of about 1 liter per hour (L/h) through the inside volume, which rate may nevertheless be modified as a function of the nature of the material to be obtained.

As mentioned above, the molten bath 22 may be refilled progressively while the ingot is being drawn so as to obtain an ingot of greater length, thereby making it possible in continuous manner to fabricate ingots that are relatively long.

The resulting crystallized ingot 28 is then machined in order to obtain the final part with the desired shape. By way of example, the machining may be performed using diamond tools. As mentioned above, using the above-described values for drawing speed and speed of rotation serves to concentrate defects in the microstructure at the periphery of the ingot 28, thus enabling them to be eliminated during the machining step. The invention thus makes it possible in relatively simple manner to obtain turbine engine hot parts made out of single-crystal or multi-crystal ceramic material of eutectic composition. Parts fabricated in this way have a microstructure that is controlled, giving them the desired mechanical properties.

Example

Fabricating an Ingot of $Al_2O_3$-YAG-$ZrO_2$ of Eutectic Composition

Use was made of an iridium crucible having the following dimensions: diameter 60 mm, height 60 mm, and thickness 1.5 mm. The crucible contained a ternary composition comprising $Al_2O_3$, $Y_2O_3$, and $ZrO_2$.

The composition was prepared by mixing the various ingredients in the following proportions: $Al_2O_3$ 65 molar percent (mol %), $Y_2O_3$ 16 mol %, and $ZrO_2$ 19 mol % followed by high-temperature sintering in order to obtain the following eutectic mixture $Al_2O_3$-YAG-$ZrO_2$.

The eutectic mixture obtained in that way was melted by induction heating in order to form the molten bath in the crucible. During the drawing, the crucible 24 was present in the inside volume as defined by a thermally insulating wall provided with a screen.

Figure 4:
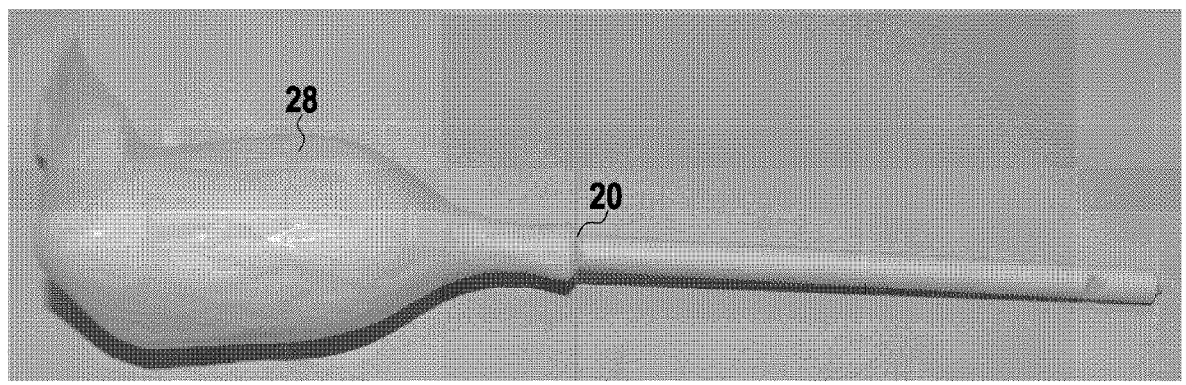
FIGS. 4 and 5 are photographs of ingots obtained by performing a Czochralski process in the context of a method of the invention.

A seed 20 having the same composition as the molten bath was put into contact with the bath in order to initiate crystallization of the ingot. The molten bath was maintained at a temperature close to 1750° C. during the drawing, and the drawing was carried out in an atmosphere of argon. The seed 20, together with the ingot being formed thereon, were then drawn vertically while imposing a drawing speed of 2 mm/h and a speed of rotation of 2 rpm. A cylindrical ingot 28 was obtained presenting a diameter of about 30 mm and a length of about 60 mm (FIG. 4). The ingot 28 as fabricated in that way was white in color and did not present any visible microscopic defects. X-ray diffraction analysis at ambient temperature (20° C.) revealed the existence of the three phases in the ingot 28: $Al_2O_3$, YAG, and $ZrO_2$.

Figure 5:
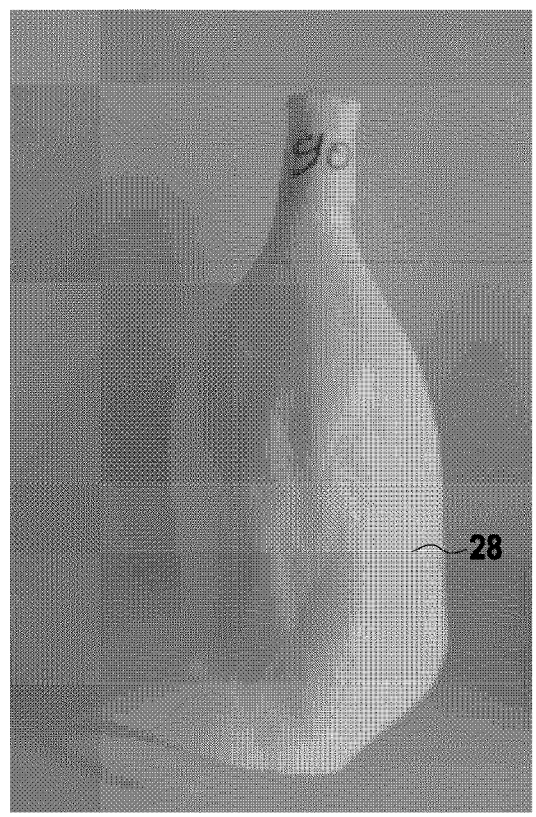

That test was reproduced several times in order to confirm that it is reproducible. FIG. 5 shows the ingot 28 obtained after reiterating that test.

The expression "lying in the range . . . to . . . " should be understood as including the bounds.

The invention claimed is:

1. A method of fabricating a turbine engine part, the method comprising:
    fabricating an ingot out of ceramic material of eutectic composition by performing the Czochralski process comprising the following steps:
        putting a seed of the ingot that is to be obtained into contact with a molten bath of a mixture of eutectic composition in order to initiate the formation of the ingot on the seed, said mixture comprising at least two ceramic compounds;
        drawing the ingot from the molten bath while imposing on the ingot that is being formed a drawing speed less than or equal to 10 mm/h together with rotation at a speed of rotation less than or equal to 50 rpm; and
    machining the ingot as fabricated in this way in order to obtain the turbine engine part,
    wherein the ingot is drawn from the molten bath along a drawing axis, and wherein a temperature gradient less than or equal to 50° C./mm is maintained in the ingot along the drawing axis, at least in the vicinity of a surface of the molten bath.

2. A method according to claim 1, wherein the eutectic mixture includes alumina.

3. A method according to claim 1, wherein the eutectic mixture includes zirconia.

4. A method according to claim 1, wherein the eutectic mixture includes at least: a rare earth oxide, an aluminum and rare earth garnet $RE_3Al_5O_{12}$, or a perovskite $REAlO_3$, where RE designates a rare earth element.

5. A method according to claim 1, wherein the eutectic mixture is selected from the following mixtures: $Al_2O_3$—$ZrO_2$, $Al_2O_3$-YAG, $RE_3Al_5O_{12}$—$Al_2O_3$ where RE is a rare element, $Al_2O_3$—$RE_3Al_5O_{12}$—$ZrO_2$, and $Al_2O_3$-YAG-$ZrO_2$.

6. A method according to claim 1, wherein the ingot being formed is subjected to a drawing speed lying in the range 1 mm/h to 5 mm/h.

7. A method according to claim 1, wherein the ingot being formed is subjected to a speed of rotation lying in the range 1 rpm to 30 rpm.

8. A method according to claim 1, wherein the fabricated part is a turbine engine blade or vane.

9. A method according to claim 1, wherein the fabricated part is a ring sector.

10. A method according to claim 1, wherein the fabricated part is a nozzle.

* * * * *